United States Patent
Min et al.

(10) Patent No.: US 7,648,884 B2
(45) Date of Patent: Jan. 19, 2010

(54) SEMICONDUCTOR DEVICE WITH INTEGRATED RESISTIVE ELEMENT AND METHOD OF MAKING

(75) Inventors: Byoung W. Min, Austin, TX (US); James K. Schaeffer, Austin, TX (US); David C. Sing, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 395 days.

(21) Appl. No.: 11/680,199

(22) Filed: Feb. 28, 2007

(65) Prior Publication Data

US 2008/0206939 A1 Aug. 28, 2008

(51) Int. Cl.
*H01L 21/20* (2006.01)
(52) U.S. Cl. .............. 438/385; 438/659; 257/E21.204
(58) Field of Classification Search ............... 438/383, 438/385, 659, 918; 257/E21.204, E21.297
See application file for complete search history.

(56) References Cited

U.S. PATENT DOCUMENTS

| | | | |
|---|---|---|---|
| 5,214,497 A | 5/1993 | Nanba et al. | |
| 6,191,018 B1 * | 2/2001 | Yue et al. | 438/592 |
| 6,406,956 B1 | 6/2002 | Tsai et al. | |
| 6,444,512 B1 * | 9/2002 | Madhukar et al. | 438/203 |
| 2006/0024893 A1 | 2/2006 | Min et al. | |
| 2006/0166457 A1 | 7/2006 | Liu et al. | |
| 2006/0186452 A1 | 8/2006 | Nam et al. | |

* cited by examiner

*Primary Examiner*—Chandra Chaudhari
(74) *Attorney, Agent, or Firm*—Kim-Marie Vo; Robert L. King (57) ABSTRACT

A resistive device (44) and a transistor (42) are formed. Each uses a portion of a metal layer (18) that is formed at the same time and thus additional process steps are avoided to remove the metal from the resistive device. The metal used in the resistive device is selectively treated to increase the resistance in the resistive device. A polycrystalline semiconductor material layer (34) overlies the metal layer in the resistive device. The combination of these layers provides the resistive device. In one form the metal is treated after formation of the polycrystalline semiconductor material layer. In one form the metal treatment involves an implant of a species, such as oxygen, to increase the resistivity of the metal. Various transistor structures are formed using the untreated portion of the metal layer as a control electrode.

18 Claims, 5 Drawing Sheets

FIG. 11

SEMICONDUCTOR DEVICE WITH INTEGRATED RESISTIVE ELEMENT AND METHOD OF MAKING

BACKGROUND

1. Field

This disclosure relates generally to semiconductor devices, and more specifically, to semiconductor devices with integrated resistive elements and methods of making the same.

2. Related Art

As device dimensions shrink, high dielectric constant (high-k or hi-k) materials are being considered for use as the gate dielectric for devices operating at the lowest voltages in a corresponding integrated circuit, henceforth referred to as core devices. However, problems exist if a high-k material, such as $HfO_2$ (hafnium oxide), is used for high voltage devices, such as an intermediate thickness gate oxide devices (henceforth known as TGO devices), a thicker gate oxide devices (henceforth known as DGO devices), or capacitors on the integrated circuit. For example, if $HfO_2$ is formed over $SiO_2$ (silicon dioxide), the Hf (hafnium) and Hf-induced defects may diffuse into the $SiO_2$ during manufacturing. The diffusion will cause poor reliability, especially in high voltage applications. In addition, using a high-k material changes the work function of the device. When the work function changes, the technology associated with the device must be typically altered, which consumes time and resources by having to develop new technology. Furthermore, it is unknown if any effects due to interaction between the high-k material and other materials at the edge of a patterned gate are created when using $HfO_2$ in a high voltage device.

Integrated circuit passive devices traditionally include polysilicon resistors. One example of forming a polysilicon resistor includes doping polysilicon to control its resistance. As indicated herein above, as integrated circuit device dimensions shrink, transistor devices are migrating to high-K dielectrics and metal gate transistors. However, added complexities and increased manufacturing costs are incurred with respect to the formation of polysilicon passive devices with the high-K dielectric and metal gate transistor devices. In other words, the traditional approaches in the formation of polysilicon passive devices are no longer suitable for use with high-K dielectric and metal gate transistor technology.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As mentioned herein above, with the advancement of technology towards smaller and smaller devices, metal gate and high-k transistors are replacing poly-Si and silicon oxy-nitride transistors. The use of metal gate electrodes is incompatible with the traditional method of forming polysilicon resistors. In conventional polysilicon technology, a 1000 Angstrom P-Poly has a resistivity on the order of 540 ohm/sq. With metal gate/high-k technologies a metal layer is typically underneath the polysilicon and above the high-k gate dielectric. It has been found that the low resistivity metal of a metal gate layer is dominant in determining a resistance of the passive device, when the passive device has been formed with polysilicon overlying the low resistivity metal. Since metal used within a metal gate stack of a transistor has low resistivity, the same metal cannot be used for a passive device with high resistance in a circuit application on the same integrated circuit, absent the embodiments of the present disclosure. For example, in metal gate technology, a 200 Angstrom TaC metal gate metal has a resistivity on the order of 70 ohm/sq. A passive element comprising a 1000 Angstrom P-Poly (540 ohm/sq) formed overlying a 100 Angstrom TaC (140 ohm/sq) provides a cumulative resistivity on the order of 111 ohm/sq.

The embodiments of the present disclosure advantageously overcome such a limitation by providing a passive device with high resistance, as discussed further herein. The embodiments include selectively treating a portion of a metal gate metal to obtain a high resistance material, wherein the high resistance material is used for forming the passive resistive element with desired high resistivity. In one embodiment, by selectively increasing a percentage of oxygen in the metal gate metal, the resistivity of the metal can be increased by an amount on the order of five to ten times (5-10×). For example, an untreated 100 Angstrom TaC having a resistivity of 140 ohm/sq can be treated, as discussed herein, to produce an increased oxygen concentration in the metal layer, and thereby resulting in a change in resistivity to a value on the order of approximately 700 to 1400 ohm/sq.

A semiconductor substrate as described herein can be any semiconductor material or combinations of materials, such as gallium arsenide, silicon germanium, silicon-on-insulator (SOI), silicon, monocrystalline silicon, the like, and combinations of the above.

Figure 1:
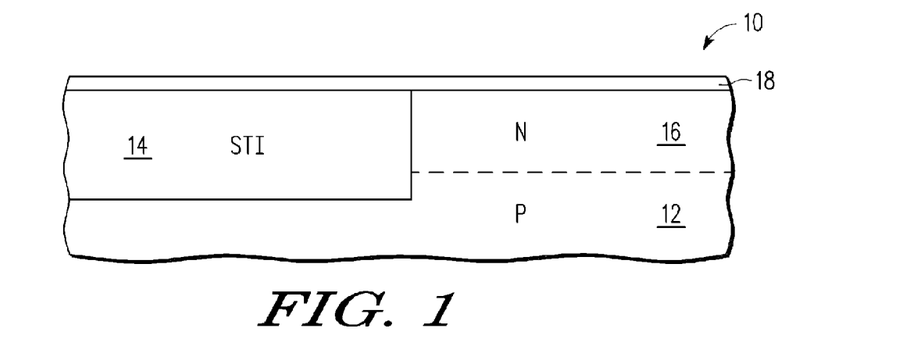
FIG. 1 is a cross-sectional view of a portion of a substrate during a process of making a semiconductor device with an integrated resistive element according to one embodiment of the present disclosure.

FIG. 1 is a cross-sectional view of a portion of a substrate in the process of making a semiconductor device 10 with an integrated resistive element according to one embodiment of the present disclosure. The making of semiconductor device 10 begins with the providing of a substrate 12, the forming of shallow trench isolation (STI) region 14, and the formation of an active area well region 16, using any suitable well known techniques. In the illustration, substrate 12 includes a P-type substrate, shallow trench isolation region 14 includes a field oxide, and active area well region 16 includes an N-type well region. A high-K dielectric layer 18 is formed overlying the shallow trench isolation region 14 and the active area well region 16, using any suitable well known techniques. The characteristics of the substrate 12, isolation region 14, active area well region 16, and high-K dielectric layer 18 are selected according to the requirements of the particular semiconductor device and integrated circuit application.

Figure 2:
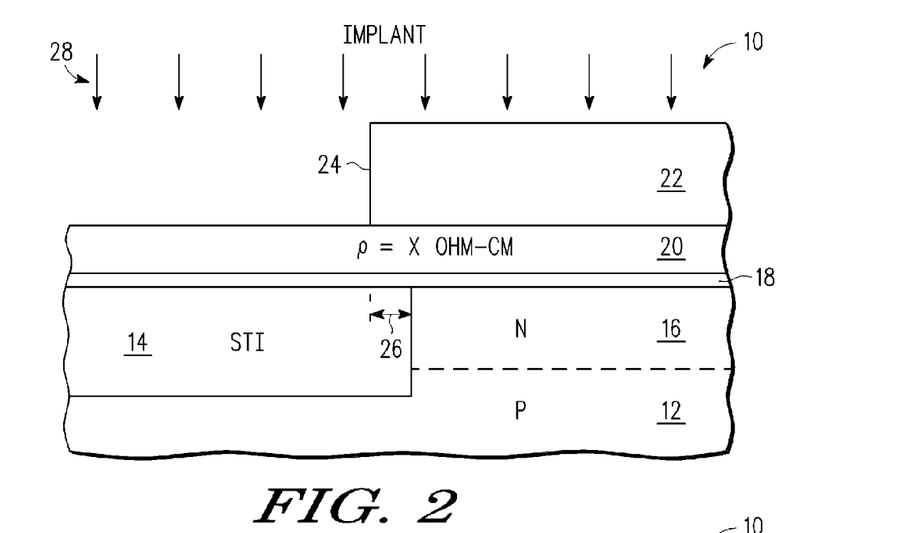
FIG. 2 is a cross-sectional view of a portion of the substrate of FIG. 1 during a further stage in the process of making a semiconductor device with an integrated resistive element according to one embodiment of the present disclosure.

FIG. 2 is a cross-sectional view of a portion of the substrate of FIG. 1 during a further stage in the process of making a semiconductor device 10 with an integrated resistive element according to one embodiment of the present disclosure. A gate metal layer 20, having a given resistivity of x ohm-cm, is formed overlying the high-K dielectric layer 18. The gate metal layer 20 is formed to include desired characteristics (i.e., composition, thickness, etc.) that are selected according to the requirements of the particular semiconductor device application. In one embodiment, gate metal layer 20 comprises PVD TaC. Subsequent to the formation of gate metal layer 20, a patterned photoresist 22 is formed. The patterned photoresist 22 overlies a region of the substrate that includes the active area well region 16, as well as, a portion of the STI region 14. In particular, a lateral edge 24 of the patterned photoresist 22 extends over a portion of the STI region 14 by a desired amount of overlap, for example, as indicated by reference numeral 26 in FIG. 2. The amount of overlap is at least an amount sufficient, such that during a subsequent increased resistivity processing of the metal layer 20, the active area well region 16 is protected from such processing.

Subsequent to the formation of patterned photoresist 22, the substrate is further processed with an ion implantation of an implant species 28 that modifies the resistivity of the metal layer 20 in the region not protected by the patterned photoresist 22. In other words, a first portion of the metal layer is selectively treated by implanting the first portion of the metal layer with an implant species that amorphizes the first portion of the metal layer. The implant species are selected from at least one of oxygen, xenon, fluorine, nitrogen, carbon, silicon, phosphorus, sulfur, chlorine, argon or krypton. In one example, the ion implant can include an atomized or ionized oxygen implant of sufficient implantation characteristics to obtain a desired increase in resistivity of the treated portion of the metal layer. Modification of the resistivity of the metal layer 20 includes increasing the resistivity from a first resistivity of x ohm-cm to a second resistivity of y ohm-cm, as designated by reference numeral 32 in FIG. 3. In addition, the ion implantation of the implant species 28 may also modify the high-K dielectric layer 18 in a region thereof not protected by the patterned photoresist 22; however, such a modification to the high-K dielectric layer does not adversely affect the resistivity of the implanted portion 32 of the metal layer. The patterned photoresist 22 is then removed using suitable processing. In another embodiment, the method comprises selectively treating the first portion of the metal layer by implanting the first portion of the metal layer with an implant species that produces at least one of a changed phase or a secondary phase in the first portion of the metal layer. In a further embodiment, the method comprises selectively treating the first portion of the metal layer by adding an impurity element to the first portion of the metal layer, wherein the impurity element can include at least one of oxygen, xenon, fluorine, nitrogen, carbon, silicon, phosphorus, sulfur, chlorine, argon or krypton.

Figure 3:
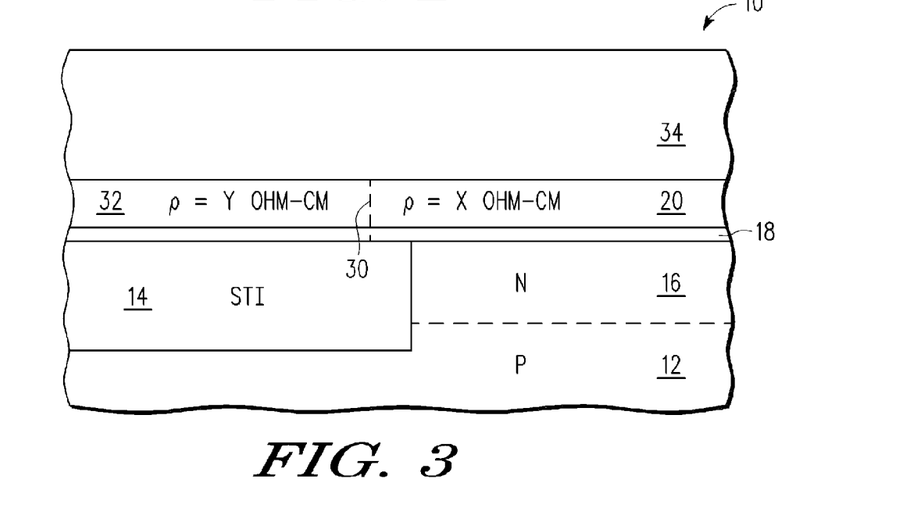
FIG. 3 is a cross-sectional view of a portion of the substrate of FIG. 2 during a further stage in the process of making a semiconductor device with an integrated resistive element according to one embodiment of the present disclosure.

FIG. 3 is a cross-sectional view of a portion of the substrate of FIG. 2 during a further stage in the process of making a semiconductor device with an integrated resistive element according to one embodiment of the present disclosure. The portion of metal layer 20 having a resistivity of x ohm-cm is separated from the post-processed portion 32 of the metal layer by an interface or boundary 30. Subsequent to modifying the resistivity of the metal layer, a polycrystalline semiconductor material 34 is formed overlying the metal layer 20 and the post-processed portion 32 of the metal layer. The polycrystalline semiconductor material 34 is formed to include desired characteristics (i.e., composition, thickness, etc.) that are selected according to the requirements of the particular semiconductor device application. In one embodiment, the polycrystalline semiconductor material 34 includes polycrystalline silicon.

Figure 4:
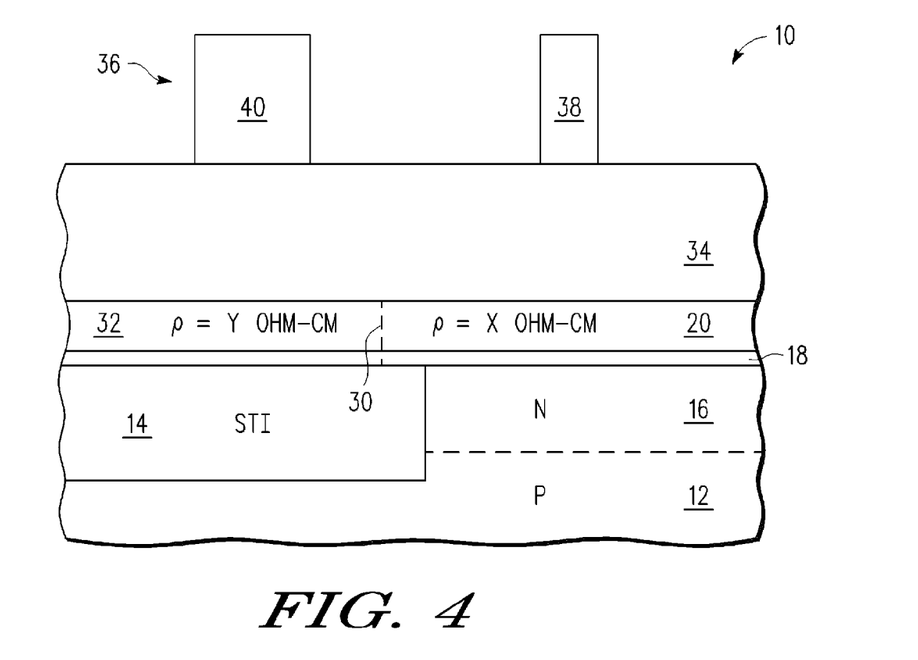
FIG. 4 is a cross-sectional view of a portion of the substrate of FIG. 3 during a further stage in the process of making a semiconductor device with an integrated resistive element according to one embodiment of the present disclosure.

FIG. 4 is a cross-sectional view of a portion of the substrate of FIG. 3 during a further stage in the process of making a semiconductor device with an integrated resistive element according to one embodiment of the present disclosure. A patterned photoresist 36 is formed overlying the polycrystalline semiconductor material 34, wherein a portion 38 of the patterned photoresist 36 defines a gate dimension of a transistor device yet to be formed. In addition, a portion 40 of the patterned photoresist 36 defines one dimension of a passive element yet to be formed.

Figure 5:
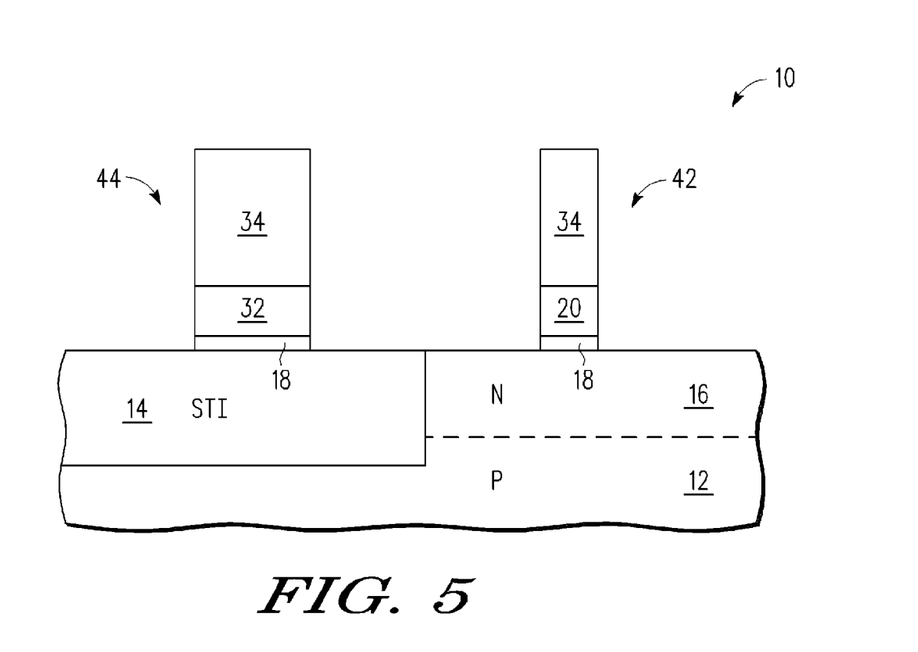
FIG. 5 is a cross-sectional view of a portion of the substrate of FIG. 4 during a further stage in the process of making a semiconductor device with an integrated resistive element according to one embodiment of the present disclosure.

FIG. 5 is a cross-sectional view of a portion of the substrate of FIG. 4 during a further stage in the process of making a semiconductor device with an integrated resistive element according to one embodiment of the present disclosure. In particular, the substrate of FIG. 4 with the patterned photoresist 36 is etched using a suitable etch process, such as, a plasma or other dry etch, followed by subsequent removal of the patterned photoresist 36. As a result, gate stack 42 and resistive element stack 44 are formed.

Figure 6:
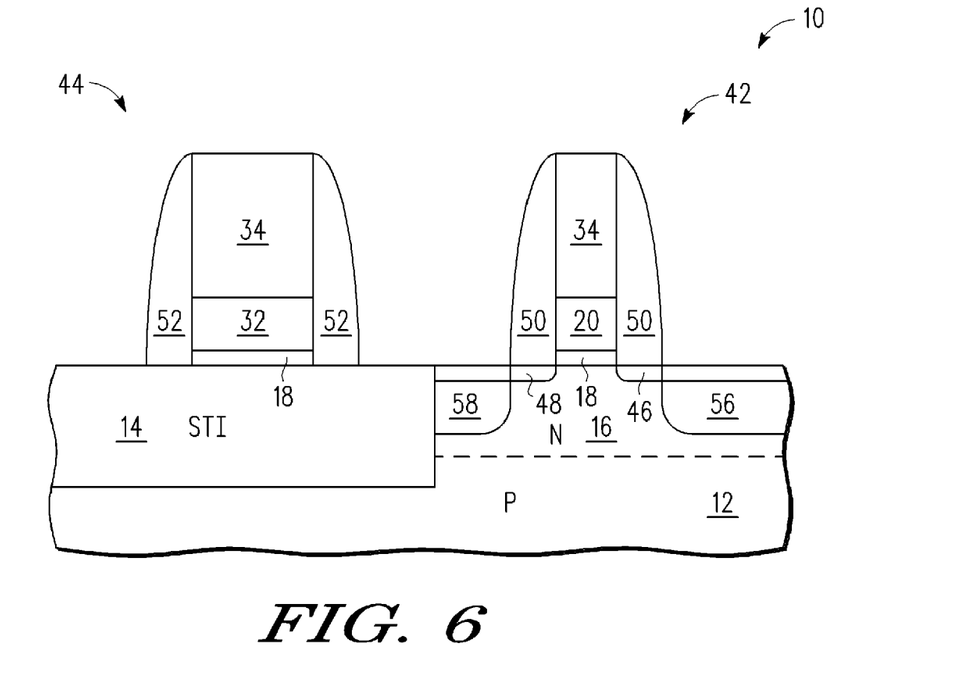
FIG. 6 is a cross-sectional view of a semiconductor device with an integrated resistive element formed by the process of making the same according to one embodiment of the present disclosure.

FIG. 6 is a cross-sectional view of a semiconductor device with an integrated resistive element formed by the process of making the same according to one embodiment of the present disclosure. Beginning with the portion of the substrate as shown in FIG. 5, processing continues with forming source and drain extension regions 46 and 48 within the active area well region 16, and forming sidewall spacers which include sidewall spacers 50 on sidewalls of gate stack 42 and sidewall spacers 52 on sidewalls of the resistive element stack 44. Subsequent to formation of the sidewall spacers, source and drain implant regions 56 and 58 are formed within the active area well region 16 using suitable S/D implants and anneals, according to the particular requirements of a given semiconductor device application.

In the illustration of FIG. 6, the resistive element stack 44 includes a width dimension that extends from the left-hand side sidewall spacer 52 to the right-hand side sidewall spacer 52. Resistive element stack 44 further includes a length dimension that extends into and out-of the page of the drawing, wherein the specific dimensions are selected according to the requirements of a given resistive element stack implementation. Subsequent to the formation of the source and drain regions, further processing includes forming silicided contact regions on both the gate stack 42 and on desired locations of the resistive element stack 44. Locations of the silicided contact regions on the resistive element stack 44 are determined according to the needs of a given resistive element stack implementation.

Figure 7:
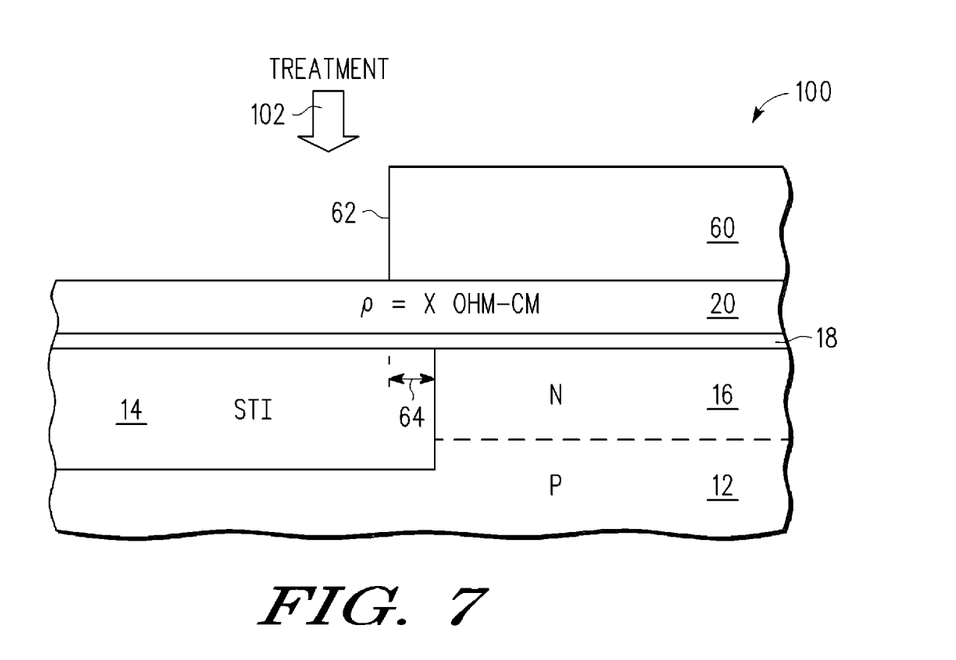
FIG. 7 is a cross-sectional view of a portion of the substrate of FIG. 1 during a further stage in the process of making a semiconductor device with an integrated resistive element according to another embodiment of the present disclosure.

FIG. 7 is a cross-sectional view of a portion of the substrate of FIG. 1 during a further stage in the process of making a semiconductor device 100 with an integrated resistive element according to another embodiment of the present disclosure. Gate metal layer 20, having a given resistivity of x ohm-cm, is formed overlying the high-K dielectric layer 18. The gate metal layer 20 is formed to include desired characteristics (i.e., composition, thickness, etc.) that are selected according to the requirements of the particular semiconductor device application. In one embodiment, gate metal layer 20 comprises TaC. Subsequent to the formation of gate metal layer 20, a patterned hardmask 60 is formed. The patterned hardmask 60 can include an oxide or nitride. Patterned hardmask 60 overlies a region of the substrate that includes the active area well region 16, as well as, a portion of the STI region 14. In particular, a lateral edge 62 of the patterned hardmask 60 extends over a portion of the STI region 14 by a desired amount of overlap, for example, as indicated by reference numeral 64 in FIG. 7. The amount of overlap is at least an amount sufficient, such that during a subsequent increased resistivity processing of the metal layer 20, the active area well region 16 is protected from such processing.

Subsequent to the formation of patterned hardmask 60, in one embodiment, the substrate is further processed with a resistivity modification treatment 102 that modifies the resistivity of the metal layer 20 in the region not protected by the patterned hardmask 60. In one embodiment, the resistivity modification treatment 102 includes treating the corresponding portion of the metal layer by performing an anneal in a gaseous ambient that increases the resistivity of that portion of the metal layer. Modification of the resistivity of the metal layer 20 includes increasing the resistivity from a first resistivity of x ohm-cm to a second resistivity of y ohm-cm, as designated by reference numeral 32 in FIG. 3. In addition, the resistivity modification treatment 102 may also modify the high-K dielectric layer 18 in a region thereof not protected by the patterned hardmask 60; however, such a modification to the high-K dielectric layer does not adversely affect the resistivity of the implanted portion 32 of the metal layer. Subsequent to the resistivity modification treatment, the patterned hardmask 60 is removed using suitable processing. The portion of the substrate illustrated in FIG. 7 is then processed in a manner similar to that as discussed herein with reference to FIGS. 3-6.

Figure 8:
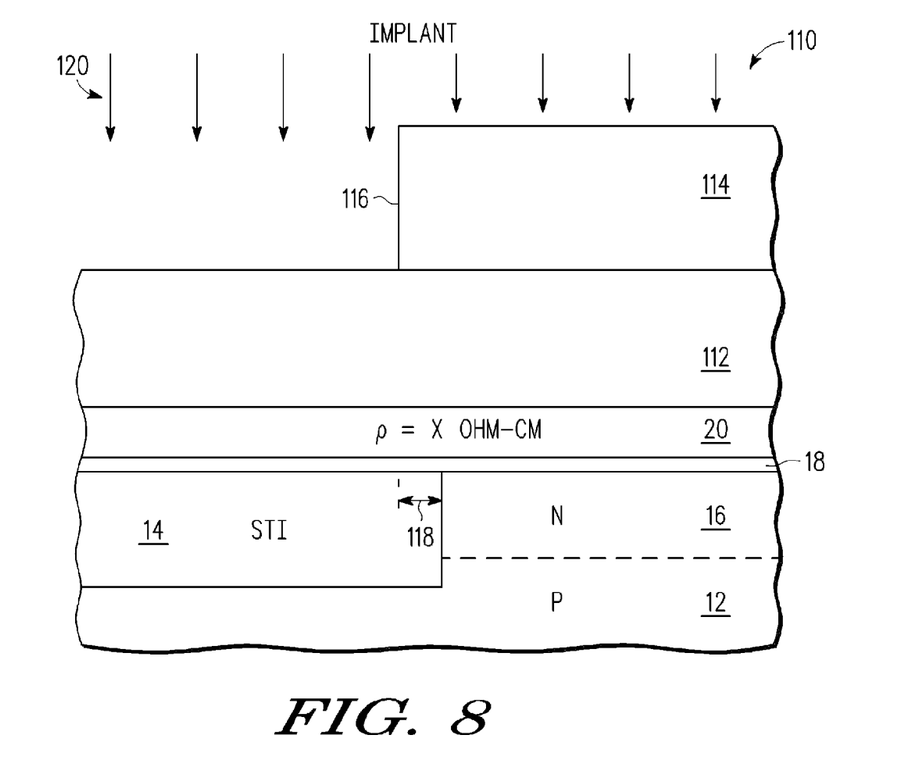
FIG. 8 is a cross-sectional view of a portion of the substrate of FIG. 1 during a further stage in the process of making a semiconductor device with an integrated resistive element according to yet another embodiment of the present disclosure.

FIG. 8 is a cross-sectional view of a portion of the substrate of FIG. 1 during a further stage in the process of making a semiconductor device with an integrated resistive element according to yet another embodiment of the present disclosure. Gate metal layer 20, having a given resistivity of x ohm-cm, is formed overlying the high-K dielectric layer 18. The gate metal layer 20 is formed to include desired characteristics (i.e., composition, thickness, etc.) that are selected according to the requirements of the particular semiconductor device and integrated circuit application. In one embodiment, gate metal layer 20 comprises TaC. Subsequent to the formation of gate metal layer 20, a polycrystalline semiconductor material 112 is formed overlying the metal layer 20. The polycrystalline semiconductor material 112 is formed to include desired characteristics (i.e., composition, thickness, etc.) that are selected according to the requirements of the particular semiconductor device application. In one embodiment, the polycrystalline semiconductor material 112 includes polycrystalline silicon.

Subsequent to formation of polycrystalline semiconductor material 112, a patterned photoresist 114 is formed. The patterned photoresist 114 overlies a region of the substrate that includes the active area well region 16, as well as, a portion of the STI region 14. In particular, a lateral edge 116 of the patterned photoresist 114 extends over a portion of the STI region 14 by a desired amount of overlap, for example, as indicated by reference numeral 118 in FIG. 2. The amount of overlap is at least an amount sufficient, such that during a subsequent increased resistivity processing of the metal layer 20, the active area well region 16 is protected from such processing.

Subsequent to the formation of patterned photoresist 114, in one embodiment, the substrate is further processed with an ion implantation of an implant species 120 that modifies the resistivity of the metal layer 20 in the region not protected by the patterned photoresist 114. In one embodiment, the ion implant includes an oxygen implant of sufficient implantation characteristics to obtain a desired increase in resistivity of the treated portion of the metal layer. Modification of the resistivity of the metal layer 20 includes increasing the resistivity from a first resistivity of x ohm-cm to a second resistivity of z ohm-cm, as designated by reference numeral 122 in FIG. 9. In addition, the ion implantation of the implant species 120 may also modify the high-K dielectric layer 18 in a region thereof not protected by the patterned photoresist 114; however, such a modification to the high-K dielectric layer does not adversely affect the resistivity of the implanted portion 122 of the metal layer. The patterned photoresist 114 is then removed using suitable processing.

Figure 9:
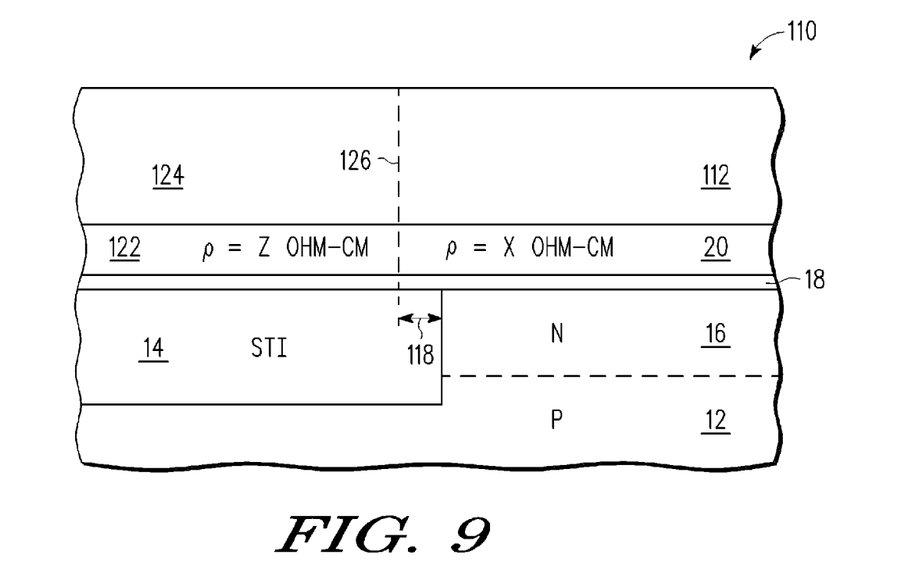
FIG. 9 is a cross-sectional view of a portion of the substrate of FIG. 8 during a further stage in the process of making a semiconductor device with an integrated resistive element according to the yet another embodiment of the present disclosure.

FIG. 9 is a cross-sectional view of a portion of the substrate of FIG. 8 during a further stage in the process of making a semiconductor device with an integrated resistive element according to the yet another embodiment of the present disclosure. As a result of the resistivity treatment discussed with respect to FIG. 8, the portion of metal layer 20 having a resistivity of x ohm-cm is separated from the post-processed portion 122 of the metal layer by an interface or boundary 126. The portion of the substrate illustrated in FIG. 9 is then processed in a manner similar to that as discussed herein with reference to FIGS. 4-6.

Figure 10:
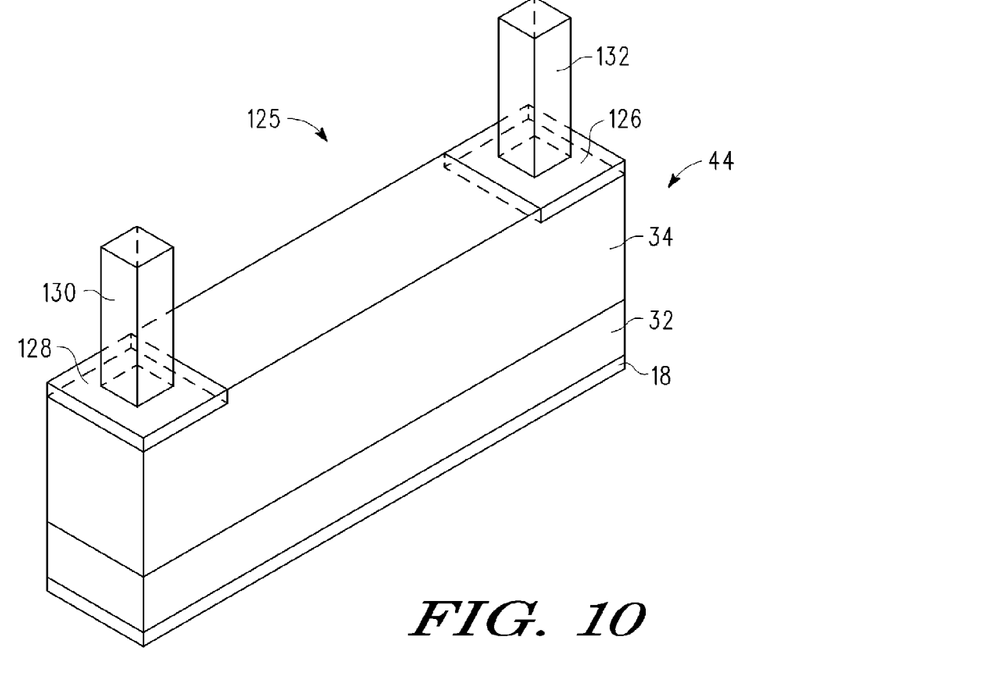
FIG. 10 is a three-dimensional plan view of a portion of an integrated resistive element according to one embodiment of the present disclosure, wherein the resistive element comprises a resistor.

FIG. 10 is a three-dimensional plan view of a portion of an integrated resistive element 125 according to one embodiment of the present disclosure, wherein the resistive element comprises a resistor. The resistive element 125 is formed with use of the passive device stack 44 of FIG. 6 and further includes first and second spaced apart silicide regions 126 and 128, respectively. The passive device stack 44 of FIG. 6 is representative of a cross-section of element 125, wherein one of the silicide regions is in front of the plane of the drawing and the other is behind the plane of the drawing. Referring back to FIG. 10, the effective resistance of the resistive element 125 is proportional to the composition of the passive device stack 44 and the spacing between the first silicide region 126 and the second silicide region 128. The spacing between the first silicide region 126 and the second silicide region 128 is thus selected according to the make-up of the passive device stack 44 and the requirements of a particular integrated resistive element application. Subsequent to formation of the first and second silicide regions, terminals 130 and 132 are formed for providing electrical contact to the corresponding silicide regions. Terminals 130 and 132 comprise any suitable conductive material, wherein the conductive material is compatible for the given process flow used in the manufacture of the passive device stack and corresponding resistive element.

Figure 11:
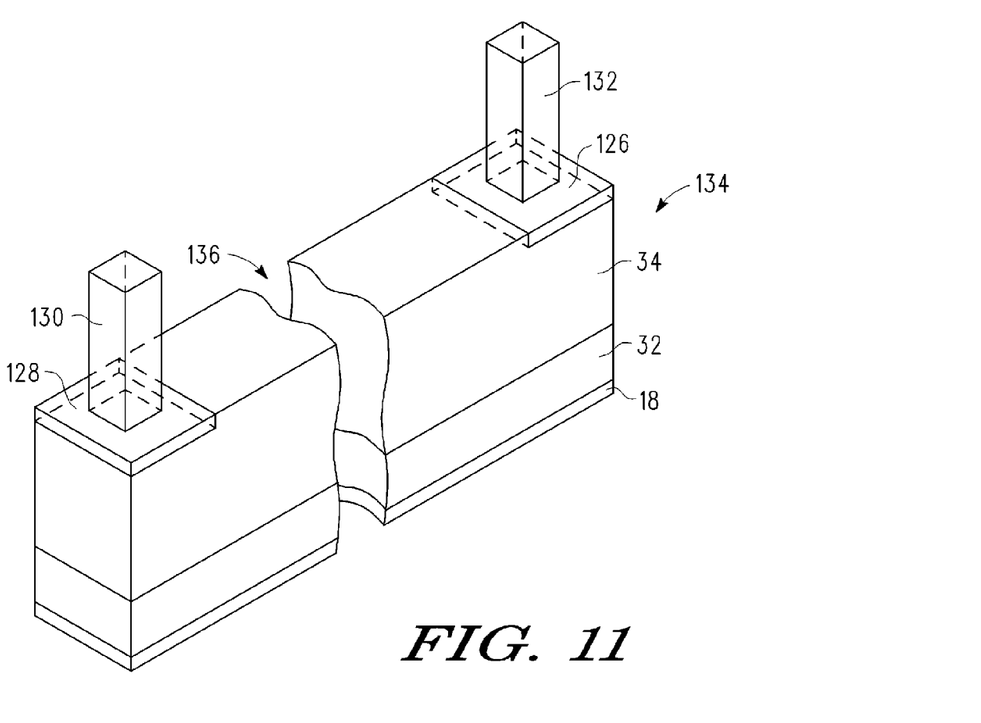
FIG. 11 is a three-dimensional plan view of a portion of an integrated resistive element according to another embodiment of the present disclosure, wherein the resistive element comprises a fuse.

FIG. 11 is a three-dimensional plan view of a portion of an integrated resistive element 134 according to another embodiment of the present disclosure, wherein the resistive element comprises a fuse. The resistive element 134 is formed with use of the passive device stack 44 of FIG. 6 and further includes first and second spaced apart silicide regions 126 and 128, respectively. The passive device stack 44 of FIG. 6 is representative of a cross-section of element 134, wherein one of the silicide regions is in front of the plane of the drawing and the other is behind the plane of the drawing. Referring back to FIG. 11, the fuse characteristics of the resistive element 134 are proportional to the composition of the passive device stack 44 and the spacing between the first silicide region 126 and the second silicide region 128, in addition to a height and width dimensions of the polysilicon 34 of the passive device stack. The spacing between the first silicide region 126 and the second silicide region 128, as well as height and width dimensions, are thus selected according to the make-up of the passive device stack 44 and the requirements of a particular integrated resistive element fuse application. Subsequent to formation of the first and second silicide regions, terminals 130 and 132 are formed for providing electrical contact to the corresponding silicide regions. Terminals 130 and 132 comprise any suitable conductive material, wherein the conductive material is compatible for the given process flow used in the manufacture of the passive device stack and for the resistive fuse element. In operation, responsive to a flow of current of a sufficient magnitude passing through the resistive fuse element, a portion of the passive device stack melts and creates a void. In other words, the current needs to be sufficient to create a void (i.e., create an open circuit between the first and second electrical terminals) and thus render the resistive fuse element non-conductive. The characteristics of the resistive fuse element are chosen according to the fuse requirements of the integrated circuit application for which the resistive fuse element is to be used.

By now it should be appreciated that there has been provided a number of implementations herein. According to one embodiment, the method comprises providing a semiconductor substrate and forming a metal layer overlying both a first portion of the semiconductor substrate and a second portion of the semiconductor substrate. The metal layer comprises a layer having a predetermined resistance. A first portion of the metal layer overlying the first portion of the semiconductor substrate is selectively treated to increase the predetermined resistance of the metal layer of the first portion while not increasing the resistance of a second portion of the metal layer different from the first portion. A polycrystalline semiconductor material layer is then formed overlying and in physical contact with the first portion of the metal layer. A passive resistive device is formed from the first portion of the metal layer and the polycrystalline semiconductor material layer overlying the first portion of the semiconductor substrate. In addition, a transistor is formed overlying the second portion of the semiconductor layer, wherein the second portion of the metal layer is used as a control electrode of the transistor. In one embodiment, the polycrystalline semiconductor material layer comprises a polysilicon layer.

In another embodiment, selectively treating the first portion of the metal layer is carried out by implanting the first portion of the metal layer with an implant species that amorphize the first portion of the metal layer. In a further embodiment, the method further comprises selectively treating the first portion of the metal layer by implanting the first portion of the metal layer with an implant species that produces at least one of a changed phase or a secondary phase in the first portion of the metal layer. In yet another embodiment, the method can comprise selectively treating the first portion of the metal layer by adding an impurity element to the first portion of the metal layer. In addition, the method further includes selecting at least one of oxygen, xenon, fluorine, nitrogen, carbon, silicon, phosphorus, sulfur, chlorine, argon or krypton as the impurity element or implant species.

In yet another embodiment, the method further comprises coupling first and second electrical terminals to the passive resistive device for receiving a fuse voltage for creating an open circuit between the first and second electrical terminals, the passive resistive device thereby functioning as a fuse.

In another embodiment, the method includes treating the first portion of the metal layer after forming the polycrystalline semiconductor material layer overlying the first portion of the metal layer. In a further embodiment, the method includes treating the first portion of the metal layer by performing an anneal in a gaseous ambient that increases the resistivity of the first portion of the metal layer.

In another embodiment, a method comprises providing a semiconductor substrate and forming a metal layer overlying both a first portion of the semiconductor substrate and a second portion of the semiconductor substrate, wherein the metal layer has a predetermined resistance. A first portion of the metal layer overlying the first portion of the semiconductor substrate is selectively treated to increase the predetermined resistance of the metal layer of the first portion while not increasing the resistance of a second portion of the metal layer different from the first portion. A resistive capping layer is formed overlying and in physical contact with the first portion of the metal layer, the resistive capping layer having a greater resistance than the first portion of the metal layer prior to treating the first portion of the metal layer. A passive resistive device is formed from the first portion of the metal layer and the capping layer overlying the first portion of the semiconductor substrate. In addition, a transistor is formed overlying the second portion of the semiconductor layer wherein the second portion of the metal layer is used as a control electrode of the transistor.

The method can further comprise selectively treating the first portion of the metal layer by implanting oxygen into the first portion of the metal layer. Still further, the method can also comprise providing electrical connections to the passive resistive device and coupling a programming voltage to the passive resistive device to form a void in the metal layer and capping layer that creates an open circuit between the electrical connections of the passive resistive device, the passive resistive device functioning as a fuse.

The method can still further comprise selectively treating the first portion of the metal layer by implanting the first portion of the metal layer with an implant species that amorphize the first portion of the metal layer. In another embodiment, selectively treating the first portion of the metal layer can comprise implanting the first portion of the metal layer with an implant species that produces at least one of a changed phase or a secondary phase in the first portion of the metal layer. In a further embodiment, selectively treating the first portion of the metal layer can comprise adding an impurity element to the first portion of the metal layer. Still further, treating the first portion of the metal layer can include performing a plasma anneal to increase the resistivity of the first portion of the metal layer.

In another embodiment of the present disclosure, a semiconductor device comprises a metal layer having an increased sheet resistivity by being treated with an implant species; and a polysilicon layer adjacent to and in contact with the metal layer, the polysilicon layer having a sheet resistivity that is less than the increased sheet resistivity of the metal layer, the metal layer and polysilicon layer forming a resistive device having first and second terminals. The semiconductor device further comprises a transistor lateral to the resistive device, the transistor having a gate that uses a different portion of metal from the metal layer, the different portion of the metal having a lower sheet resistivity than the increased sheet resistivity.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method comprising:
providing a semiconductor substrate;
forming a metal layer having a predetermined resistance and overlying both a first portion of the semiconductor substrate and a second portion of the semiconductor substrate;
selectively treating a first portion of the metal layer overlying the first portion of the semiconductor substrate to increase the predetermined resistance of the metal layer of the first portion while not increasing the resistance of a second portion of the metal layer different from the first portion;
forming a polycrystalline semiconductor material layer overlying and in physical contact with the first portion of the metal layer;
forming a passive resistive device from the first portion of the metal layer and the polycrystalline semiconductor material layer overlying the first portion of the semiconductor substrate; and
forming a transistor overlying the second portion of the semiconductor layer, wherein the second portion of the metal layer is used as a control electrode of the transistor.

2. The method of claim 1 further comprising:
providing the polycrystalline semiconductor material layer as a polysilicon layer.

3. The method of claim 1 further comprising:
selectively treating the first portion of the metal layer by implanting the first portion of the metal layer with an implant species that amorphize the first portion of the metal layer.

4. The method of claim 3 further comprising:
selecting at least one of oxygen, xenon, fluorine, nitrogen, carbon, silicon, phosphorus, sulfur, chlorine, argon or krypton as the implant species.

5. The method of claim 1 further comprising:
selectively treating the first portion of the metal layer by implanting the first portion of the metal layer with an implant species that produces at least one of a changed phase or a secondary phase in the first portion of the metal layer.

6. The method of claim 5 further comprising:
selecting at least one of oxygen, xenon, fluorine, nitrogen, carbon, silicon, phosphorus, sulfur, chlorine, argon or krypton as the implant species.

7. The method of claim 1 further comprising:
selectively treating the first portion of the metal layer by adding an impurity element to the first portion of the metal layer.

8. The method of claim 7 further comprising:
selecting at least one of oxygen, xenon, fluorine, nitrogen, carbon, silicon, phosphorus, sulfur, chlorine, argon or krypton as the implant species.

9. The method of claim 1 further comprising:
coupling first and second electrical terminals to the passive resistive device for receiving a fuse voltage for creating an open circuit between the first and second electrical terminals, the passive resistive device thereby functioning as a fuse.

10. The method of claim 1 further comprising:
treating the first portion of the metal layer after forming the polycrystalline semiconductor material layer overlying the first portion of the metal layer.

11. The method of claim 1 further comprising:
treating the first portion of the metal layer by performing an anneal in a gaseous ambient that increases the resistivity of the first portion of the metal layer.

12. A method comprising:

providing a semiconductor substrate;

forming a metal layer having a predetermined resistance and overlying both a first portion of the semiconductor substrate and a second portion of the semiconductor substrate;

selectively treating a first portion of the metal layer overlying the first portion of the semiconductor substrate to increase the predetermined resistance of the metal layer of the first portion while not increasing the resistance of a second portion of the metal layer different from the first portion;

forming a resistive capping layer overlying and in physical contact with the first portion of the metal layer, the resistive capping layer having a greater resistance than the first portion of the metal layer prior to treating the first portion of the metal layer;

forming a passive resistive device from the first portion of the metal layer and the capping layer overlying the first portion of the semiconductor substrate; and forming a transistor overlying the second portion of the semiconductor layer wherein the second portion of the metal layer is used as a control electrode of the transistor.

13. The method of claim 12 further comprising:

selectively treating the first portion of the metal layer by implanting oxygen into the first portion of the metal layer.

14. The method of claim 12 further comprising:

providing electrical connections to the passive resistive device; and coupling a programming voltage to the passive resistive device to form a void in the metal layer and capping layer that creates an open circuit between the electrical connections of the passive resistive device, the passive resistive device functioning as a fuse.

15. The method of claim 12 further comprising:

selectively treating the first portion of the metal layer by implanting the first portion of the metal layer with an implant species that amorphize the first portion of the metal layer.

16. The method of claim 12 further comprising:

selectively treating the first portion of the metal layer by implanting the first portion of the metal layer with an implant species that produces at least one of a changed phase or a secondary phase in the first portion of the metal layer.

17. The method of claim 12 further comprising:

selectively treating the first portion of the metal layer by adding an impurity element to the first portion of the metal layer.

18. The method of claim 12 further comprising:

treating the first portion of the metal layer by performing a plasma anneal to increase the resistivity of the first portion of the metal layer.

* * * * *